United States Patent
Siddiqui et al.

(10) Patent No.: US 10,644,101 B2
(45) Date of Patent: May 5, 2020

(54) LEVEL SHIFTER AND SEMICONDUCTOR DEVICE

(71) Applicant: Nuvoton Technology Corporation, Hsinchu (TW)

(72) Inventors: Md Imran Siddiqui, Hsinchu (TW); Po-An Chen, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 128 days.

(21) Appl. No.: 15/878,433

(22) Filed: Jan. 24, 2018

(65) Prior Publication Data

US 2018/0212020 A1 Jul. 26, 2018

(30) Foreign Application Priority Data

Jan. 26, 2017 (TW) .............................. 106103122 A

(51) Int. Cl.
  *H01L 29/06* (2006.01)
  *H01L 21/76* (2006.01)
  *H03K 3/36* (2006.01)
  *H01L 21/761* (2006.01)

(52) U.S. Cl.
  CPC .......... *H01L 29/063* (2013.01); *H01L 21/761* (2013.01); *H03K 3/36* (2013.01)

(58) Field of Classification Search
  CPC .......... H04J 1/02; H01L 21/76; H01L 21/761; H01L 29/06; H01L 29/063
  USPC ........................................................ 257/493
  See application file for complete search history.

(56) References Cited

U.S. PATENT DOCUMENTS

| 5,296,393 A | 3/1994 | Smayling et al. |
|---|---|---|
| 7,439,122 B2 | 10/2008 | Shimizu |
| 7,582,946 B2 | 9/2009 | Shimizu |
| 8,933,534 B2 | 1/2015 | Shi et al. |
| 10,297,676 B2* | 5/2019 | Yang ................. H01L 29/66659 |
| 2011/0316078 A1 | 12/2011 | Kim et al. |
| 2012/0086052 A1 | 4/2012 | Chen et al. |
| 2012/0139041 A1 | 6/2012 | Su et al. |
| 2012/0217574 A1* | 8/2012 | Kumano ............. H01L 27/0623 257/327 |
| 2014/0054695 A1 | 2/2014 | Su et al. |
| 2014/0065781 A1 | 3/2014 | Chen et al. |
| 2014/0203406 A1* | 7/2014 | Shi ....................... H01L 21/265 257/544 |
| 2015/0162324 A1 | 6/2015 | Mauder et al. |

(Continued)

FOREIGN PATENT DOCUMENTS

| CN | 102208450 | 4/2013 |
|---|---|---|
| TW | 201616602 | 5/2016 |
| TW | I548029 | 9/2016 |

*Primary Examiner* — Fazli Erdem
(74) *Attorney, Agent, or Firm* — JCIPRNET

(57) ABSTRACT

A level shifter is provided. The level shifter is located between a high-side circuit area and a low-side circuit area and includes a substrate, a buried island, and an isolation structure. The buried island has a first conductivity type and is located in the substrate. The isolation structure has a second conductivity type, is located in the substrate and surrounds the buried island. In addition, a dimension of the isolation structure near the high-side circuit area is different from a dimension of the isolation structure near the low-side circuit area. A semiconductor device including the level shifter is also provided.

16 Claims, 6 Drawing Sheets

(56) References Cited

U.S. PATENT DOCUMENTS

2018/0190765 A1* 7/2018 Wen .................... H01L 29/7809
2018/0190767 A1* 7/2018 Siddiqui ............. H01L 29/7835

* cited by examiner

LEVEL SHIFTER AND SEMICONDUCTOR DEVICE

CROSS-REFERENCE TO RELATED APPLICATION

This application claims the priority benefit of Taiwan application serial no. 106103122, filed on Jan. 26, 2017. The entirety of the above-mentioned patent application is hereby incorporated by reference herein and made a part of this specification.

FIELD OF THE INVENTION

The invention relates to a level shifter and a semiconductor device including the level shifter.

DESCRIPTION OF RELATED ART

In recent years, high voltage integrated circuits are mainly applied in power switch circuits, for instance, acting as power switches in a variety of power management devices. Generally, a high voltage integrated circuit includes a high-side circuit area and a low-side circuit area. A low voltage signal is level-shifted upward to a high voltage signal through a level shifter. However, the existing level shifters often generate leakage currents or experience a breakdown voltage drop caused by uneven electric field distribution.

SUMMARY OF THE INVENTION

Accordingly, the invention provides a level shifter and a semiconductor device including the level shifter for effectively suppressing a leakage current and increasing a breakdown voltage so as to enhance the performance of the device.

In an embodiment of the invention, a level shifter is provided. The level shifter is located between a high-side circuit area and a low-side circuit area and includes a substrate, a buried island and an isolation structure. The buried island has a first conductivity type and is buried in the substrate. The isolation structure has a second conductivity type, is located in the substrate, and surrounds the buried island. In addition, a dimension of the isolation structure near the high-side circuit area is different from a dimension of the isolation structure near the low-side circuit area.

In an embodiment of the invention, the dimension includes a length, a width or both.

In an embodiment of the invention, a width of the isolation structure decreases gradually or decreases in a stepwise manner in a direction away from the high-side circuit area.

In an embodiment of the invention, a doping concentration of the isolation structure decreases gradually in a direction away from the high-side circuit area.

In an embodiment of the invention, the isolation structure is a bulk isolation doped region.

In an embodiment of the invention, the isolation structure has a plurality of separated isolation doped regions. An (i+1)-th isolation doped region is closer to the low-side circuit area than a i-th isolation doped region, and i is a positive integer.

In an embodiment of the invention, a length of the (i+1)-th isolation doped region is less than a length of the i-th isolation doped region.

In an embodiment of the invention, a doping concentration of the (i+1)-th isolation doped region is less than a doping concentration of the i-th isolation doped region.

In an embodiment of the invention, the level shifter further includes a doped region of the first conductivity type. The doped region is located in the substrate between the buried island and the low-side circuit area and is surrounded by the isolation structure.

In an embodiment of the invention, the doped region serves as a drain of the level shifter.

In an embodiment of the invention, a semiconductor device is provided. The semiconductor device includes a substrate, a high-side circuit and a level shifter. The substrate has a high-side circuit area, a terminal area and a low-side circuit area. The low-side circuit area surrounds the high-side circuit area, and the terminal area is located between the high-side circuit area and the low-side circuit area. The high-side circuit is located in the high-side circuit area and includes a buried layer. The buried layer has a first conductivity type and is buried in the substrate. The level shifter is located in the terminal area and includes a substrate, a buried island and an isolation structure. The buried island has the first conductivity type and is buried in the substrate. The isolation structure has a second conductivity type, is located in the substrate, and surrounds the buried island. A dimension of the isolation structure near the high-side circuit area is different from a dimension of the isolation structure near the low-side circuit area. Besides, a concave surface of the buried layer corresponds to a convex surface of the buried island, and the isolation structure is located between the buried layer and the buried island.

In an embodiment of the invention, the high-side circuit area is a high-side bridge circuit area, and the low-side circuit area is a low-side bridge circuit area.

In an embodiment of the invention, a width, a length, or both of the isolation structure decrease gradually or decrease in a stepwise manner in a direction away from the high-side circuit area.

In an embodiment of the invention, the level shifter further includes a doped region. The doped region has a first conductivity type, is located in the substrate between the buried island and the low-side circuit area, and is surrounded by the isolation structure.

In an embodiment of the invention, a doping concentration of the isolation structure decreases gradually in a direction away from the high-side circuit area.

In an embodiment of the invention, the isolation structure has a first isolation doped region, a second isolation doped region and a third isolation doped region. The first isolation doped region is adjacent to the high-side circuit area and is located completely between the buried layer and the buried island. The second isolation doped region is adjacent to the first isolation doped region and a portion of the second isolation doped region is located between the buried layer and the buried island. The third isolation doped region is adjacent to the second isolation doped region and the low-side circuit area.

In an embodiment of the invention, the first isolation doped region is in contact with the second isolation doped region, and the second isolation doped region is in contact with the third isolation doped region.

In an embodiment of the invention, the first isolation doped region, the second isolation doped region and the third isolation doped region are separated from one another.

In an embodiment of the invention, a level shifter is further provided. The level shifter is located between a high-side circuit area and a low-side circuit area and includes a substrate, a buried island and an isolation structure. The buried island has a first conductivity type and is located in the substrate. The isolation structure has a second conductivity type, is located in the substrate, and surrounds the buried island. A width of the isolation structure is substantially unchanged, but a doping concentration of the isolation structure near the high-side circuit area is different from a doping concentration of the isolation structure near the low-side circuit area.

In an embodiment of the invention, the doping concentration of the isolation structure decreases gradually or decreases in a stepwise manner in a direction away from the high-side circuit area.

In view of the foregoing, an isolation structure with a gradually changed dimension and/or a gradually changed doping concentration is disposed in the semiconductor device or the level shifter of the invention, such that the isolation region can be fully depleted, the accumulation of high electric field effect between the high-side circuit area and the low-side circuit area can be uniformly dispersed, the leakage current can be effectively suppressed, and the breakdown voltage can be accordingly increased.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

In the following embodiments, when a first conductivity type is N-type, a second conductivity type is P-type. When the first conductivity type is P-type, the second conductivity type is N-type. The below embodiments in which the first conductivity type is exemplified as N-type and the second conductivity type is exemplified as P-type are provided for illustration purposes, and are not construed as limiting the present invention. In an embodiment, an N-type dopant includes phosphorous or arsenic, and a P-type dopant includes boron.

Figure 4:
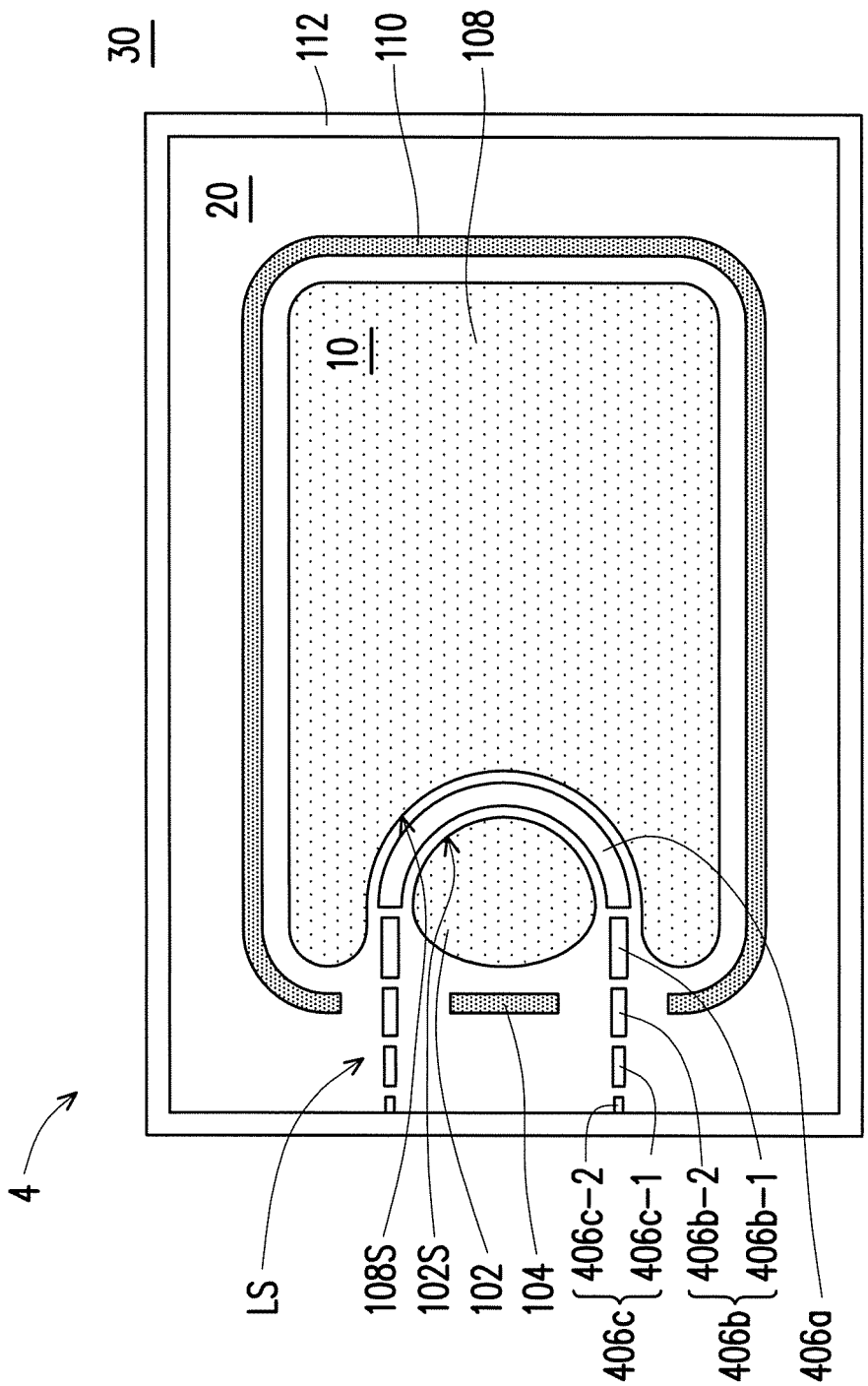
Figure 5:
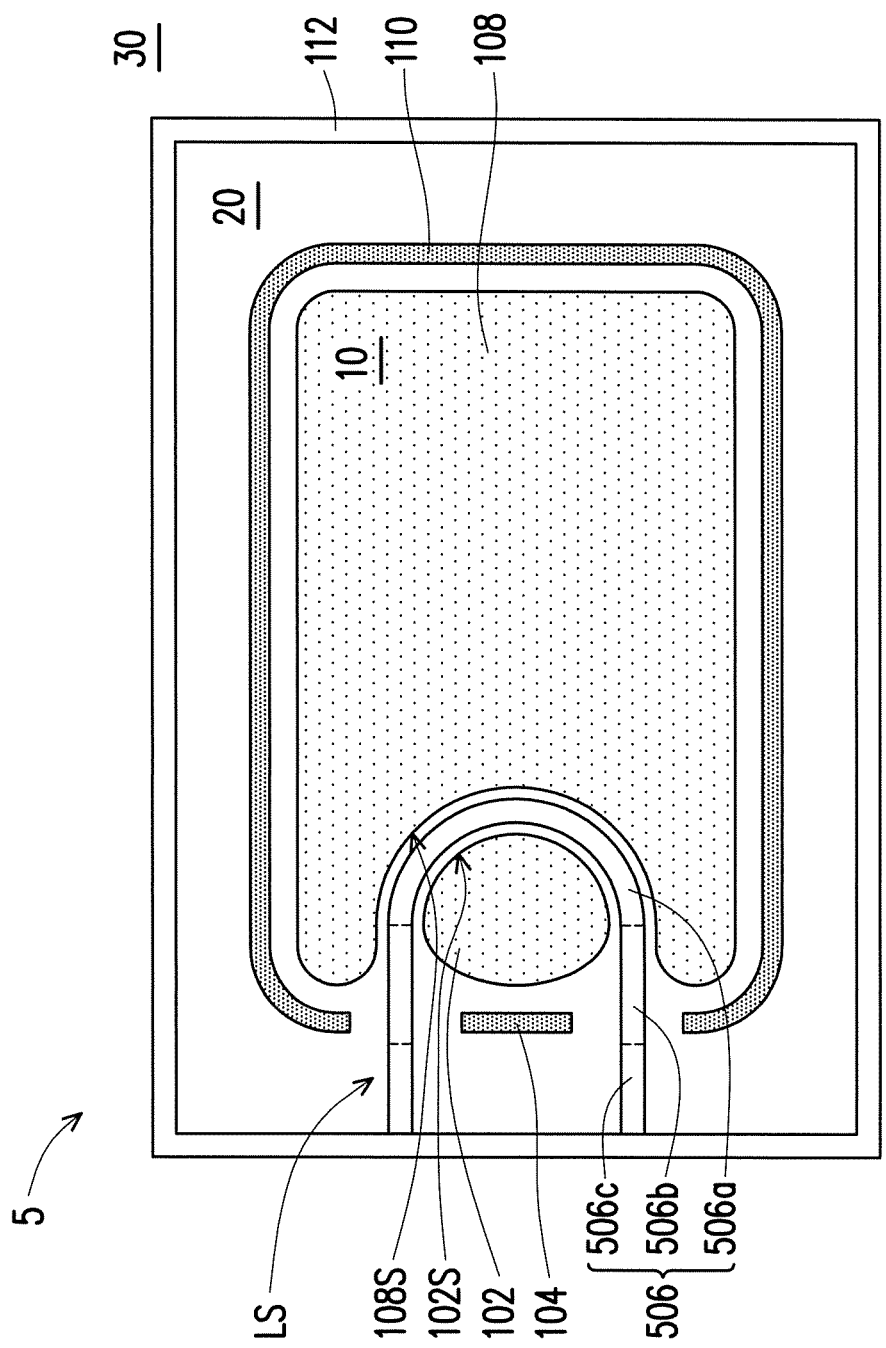
Figure 6:
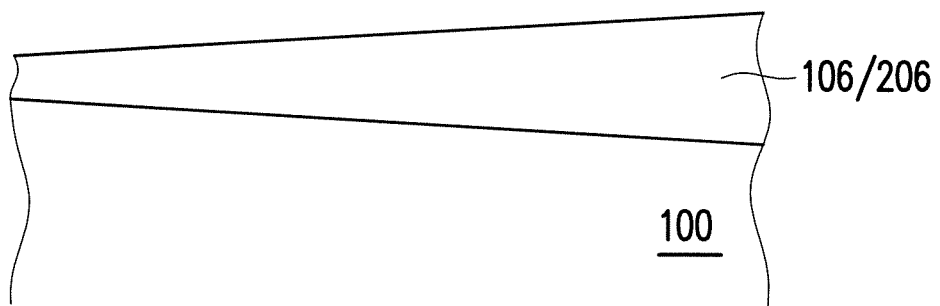
FIG. 6 to FIG. 8 are schematic cross-sectional views illustrating isolation structures of semiconductor devices according to some embodiments of the invention.
Figure 7:
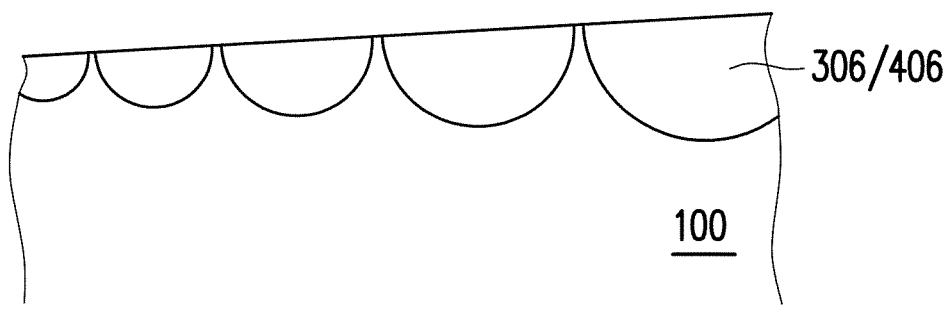
Figure 8:
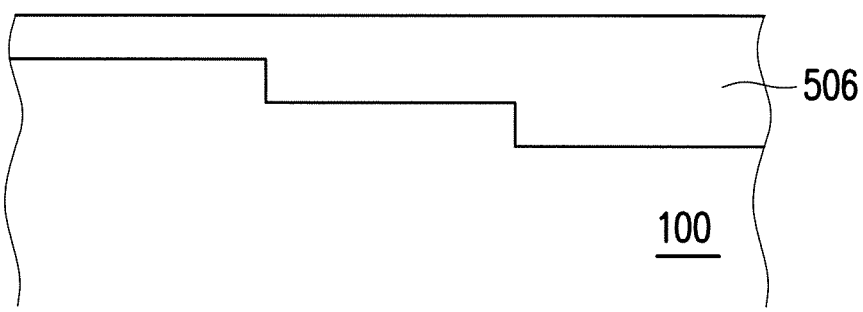

FIG. 1 to FIG. 5 are top perspective views illustrating semiconductor devices according to some embodiments of the invention. FIG. 6 to FIG. 8 are schematic cross-sectional views illustrating isolation structures of semiconductor devices according to some embodiments of the invention. In order to give a simplified but clear description, relative relations among only some of the components are illustrated. It should be noted that, the components are not required to be formed in the same plane. In other words, the distance between the substrate surface and the top or bottom surface of each of the components is not required to be identical and can be adjusted upon the process requirements.

Figure 1:
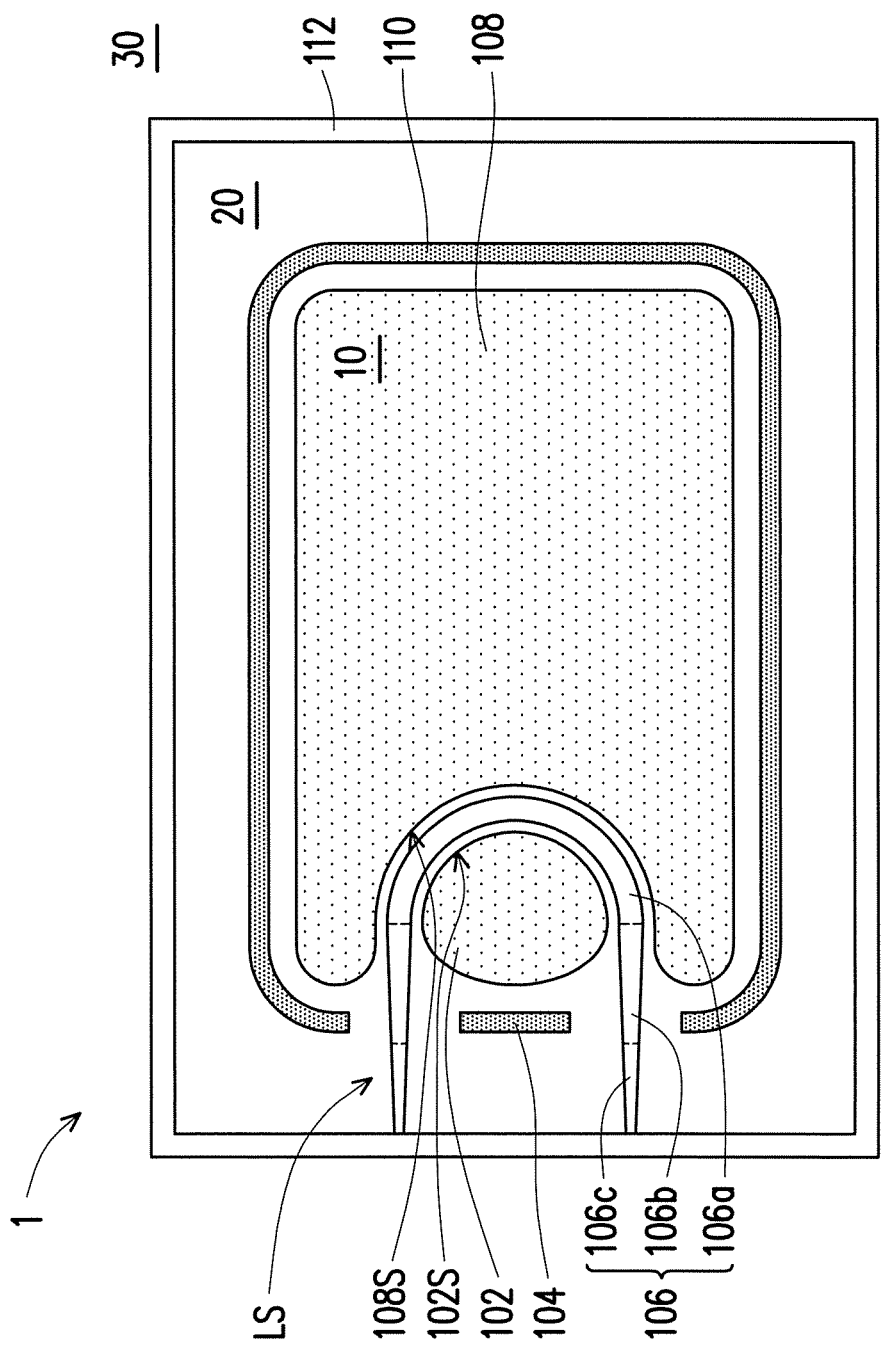
FIG. 1 to FIG. 5 are top perspective views illustrating semiconductor devices according to some embodiments of the invention.

Referring to FIG. 1 and FIG. 6, a semiconductor device 1 of the invention includes a substrate 100. The substrate 100 includes a semiconductor material. In an embodiment, the substrate 100 can be a semiconductor substrate of a second conductivity type (e.g., P-type), such as a P-type silicon-containing epitaxial layer. The substrate 100 can have a P-type or an N-type well region as required. In an embodiment, the substrate 100 has a high-side circuit area 10, a terminal area 20 and a low-side circuit area 30. Specifically, the low-side circuit area 30 surrounds the high-side circuit area 10, and the terminal area 20 is located between the high-side circuit area 10 and the low-side circuit area 30. In an embodiment, the high-side circuit area can be a high-side bridge circuit area, and the low-side circuit area can be a low-side bridge circuit area.

The semiconductor device 1 of the invention further includes a high-side circuit with an operating voltage of approximately 600 V or higher. In an embodiment, the high-side circuit is located in the high-side circuit area 10 and includes a buried layer 108 of the first conductivity type (e.g., N type) and a doped region 110 of the first conductivity type (e.g., N type). The buried layer 108 and the doped region 110 are both located in the substrate 100. In an embodiment, referring to the top view of FIG. 1, the buried layer 108 is a bulk buried layer. Specifically, a side of the buried layer 108 has a concave surface 108S or a curved sidewall, and the other three sides have substantial vertical sidewalls. A doping concentration of the buried layer 108 can fall within a range between $5\times10^{16}$ atoms/cm$^3$ and $1\times10^{19}$ atoms/cm$^3$. In an embodiment, the doped region 110 surrounds the substantial vertical sidewalls of the buried layer 108 but does not surround the concave surface 108S of the buried layer. A doping concentration of the doped region 110 can fall within a range between $1\times10^{18}$ atoms/cm$^3$ and $1\times10^{20}$ atoms/cm$^3$. In an embodiment, the doped region 110 serves as a floating substrate contact area of the high-side circuit and is connected to the buried layer 108. In an embodiment, a bottom surface of the doped region 110 is higher than a top surface of the buried layer 108. It is known to people having ordinary skill in the art that the high-side circuit can further include common-used components such as a gate, a source, an interconnection, and the like.

The semiconductor device 1 of the invention further includes a low-side circuit with an operating voltage of approximately 40 V or lower. The low-side circuit is located in the low-side circuit area 30 and includes a well region 112 of the second conductivity type (e.g., P type). The well region 112 is located in the substrate 100. In an embodiment, the well region 112 surrounds the terminal area 20. A doping concentration of the doped region 112 can fall within a range between $1\times10^{16}$ atoms/cm$^3$ and $1\times10^{18}$ atoms/cm$^3$.

The semiconductor device 1 of the invention further includes a level shifter LS located in the terminal area 20 for controlling signal conversion between the high-side circuit area 10 and the low-side circuit area 30. The level shifter LS of the invention includes a buried island 102 of the first conductivity type (e.g., N type) and a doped region 104 of the first conductivity type (e.g., N type).

The buried island 102 is located in the substrate 100. In an embodiment, referring to the top view of FIG. 1, the buried island 102 is an island-shaped buried block with a convex surface 102S. Specifically, opposite sides of the buried island 102 have curved sidewalls, and the curvature of the convex surface 102S at one side of the buried island 102 is greater than that of the other curved sidewall at the opposite side of the buried island 102. In the embodiment, the buried island 102 and the buried layer 108 are separated from each other, and the concave surface 108S of the buried layer 108 corresponds to the convex surface 102S of the buried island 102, as shown in FIG. 1. A doping concentration of the buried island 102 can fall within a range between $1\times10^{16}$ atoms/cm$^3$ and $5\times10^{19}$ atoms/cm$^3$. In an embodiment, the doping concentrations of the buried island 102 and the buried layer 108 are identical. In another embodiment, the doping concentrations of the buried island 102 and the buried layer 108 are different.

Besides, the doped region 104 is located in the substrate 100 between the buried island 102 and the low-side circuit area 10. A doping concentration of the doped region 104 can fall within a range between $1\times10^{17}$ atoms/cm$^3$ and $1\times10^{20}$ atoms/cm$^3$. In an embodiment, the doped region 104 serves as a drain of the level shifter LS. In an embodiment, a bottom surface of the doped region 104 is higher than a top surface of the buried island 102.

The level shifter LS of the invention further includes an isolation structure 106 of the second conductivity type (e.g., P type). In an embodiment, the isolation structure 106 is located in the substrate 100, surrounds the buried island 102 and the doped region 104, and is connected to the well region 112. In an embodiment, a doping concentration of the isolation structure 106 is generally constant and falls within a range between $1\times10^{16}$ atoms/cm$^3$ and $1\times10^{18}$ atoms/cm$^3$, for example, a range between any two numerical values of $1\times10^{16}$ atoms/cm$^3$, $5\times10^{16}$ atoms/cm$^3$, $1\times10^{17}$ atoms/cm$^3$, $5\times10^{17}$ atoms/cm$^3$, and $1\times10^{18}$ atoms/cm$^3$. Besides, a dimension of the isolation structures 106 is varied. It should be noted that, the isolation structure 106 of the invention is an isolation structure with gradual dimension changes, such that the isolation region can be fully depleted, the accumulation of high electric field effect between the high-side circuit area 10 and the low-side circuit area 30 can be uniformly dispersed, the leakage current can be effectively suppressed, and the breakdown voltage can be accordingly increased. In an embodiment, a dimension of the isolation structure 106 near the high-side circuit area 10 is different from a dimension of the isolation structure 106 near the low-side circuit area 30. In an embodiment, the dimension includes a length, a width or both.

In an embodiment, as shown in FIG. 1, a width of the isolation structure 106 decreases gradually in a direction away from the high-side circuit area 10 (or toward the low-side circuit area 30). Specifically, when viewed from the high-side circuit area 10 to the low-side circuit area 30, the isolation structure 106 has a substantially smooth sidewall. In an embodiment, the isolation structure 106 can have, for example but not limited to, a first isolation doped region 106a, a second isolation doped region 106b, and a third isolation doped region 106c. The first isolation doped region 106a is adjacent to the high-side circuit area 10 and is completely located between the buried layer 108 and the buried island 102. In an embodiment, the distance between the first isolation doped region 106a and the buried layer 108 or the buried island 102 is generally identical. The second isolation doped region 106b is adjacent to and in contact with the first isolation doped region 106a, and a portion of the second isolation doped region 106b is located between the buried layer 108 and the buried island 102. In an embodiment, a distance between the second isolation doped region 106b and the buried layer 108 or the buried island 102 increases gradually in a direction away from the high-side circuit area 10 (or toward the low-side circuit area 30). In addition, an outer boundary of the second isolation doped region 106b can exceed or be aligned with an outer boundary of the doped region 104. The third isolation doped region 106c is adjacent to the second isolation doped region 106b and the low-side circuit area 30. In an embodiment, the third isolation doped region 106c is in contact with the well region 112. Besides, as shown in FIG. 6, a doping depth of the isolation structure 106 decreases gradually in a direction away from the high-side circuit area 10.

Figure 2:
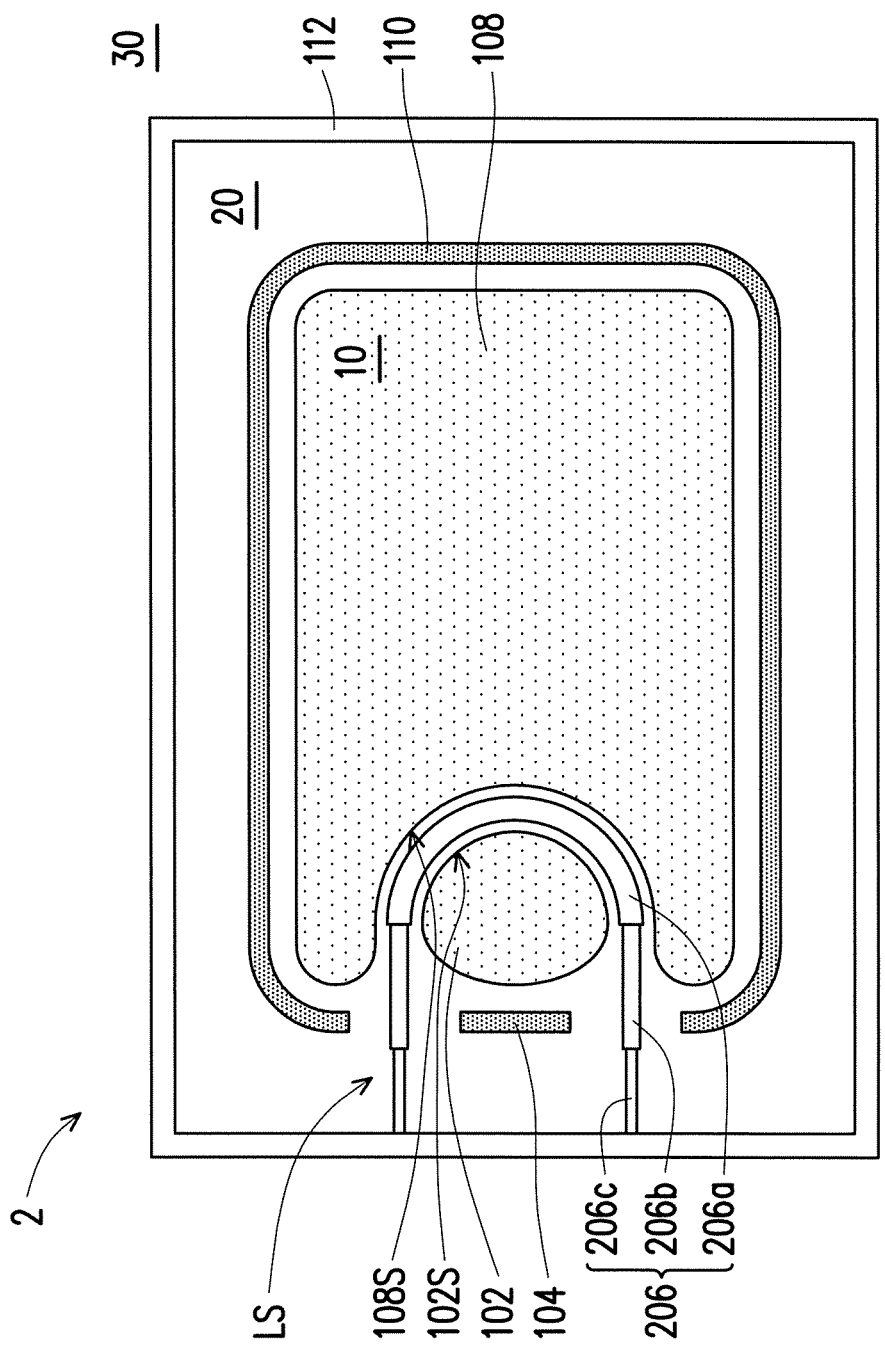
Figure 3:
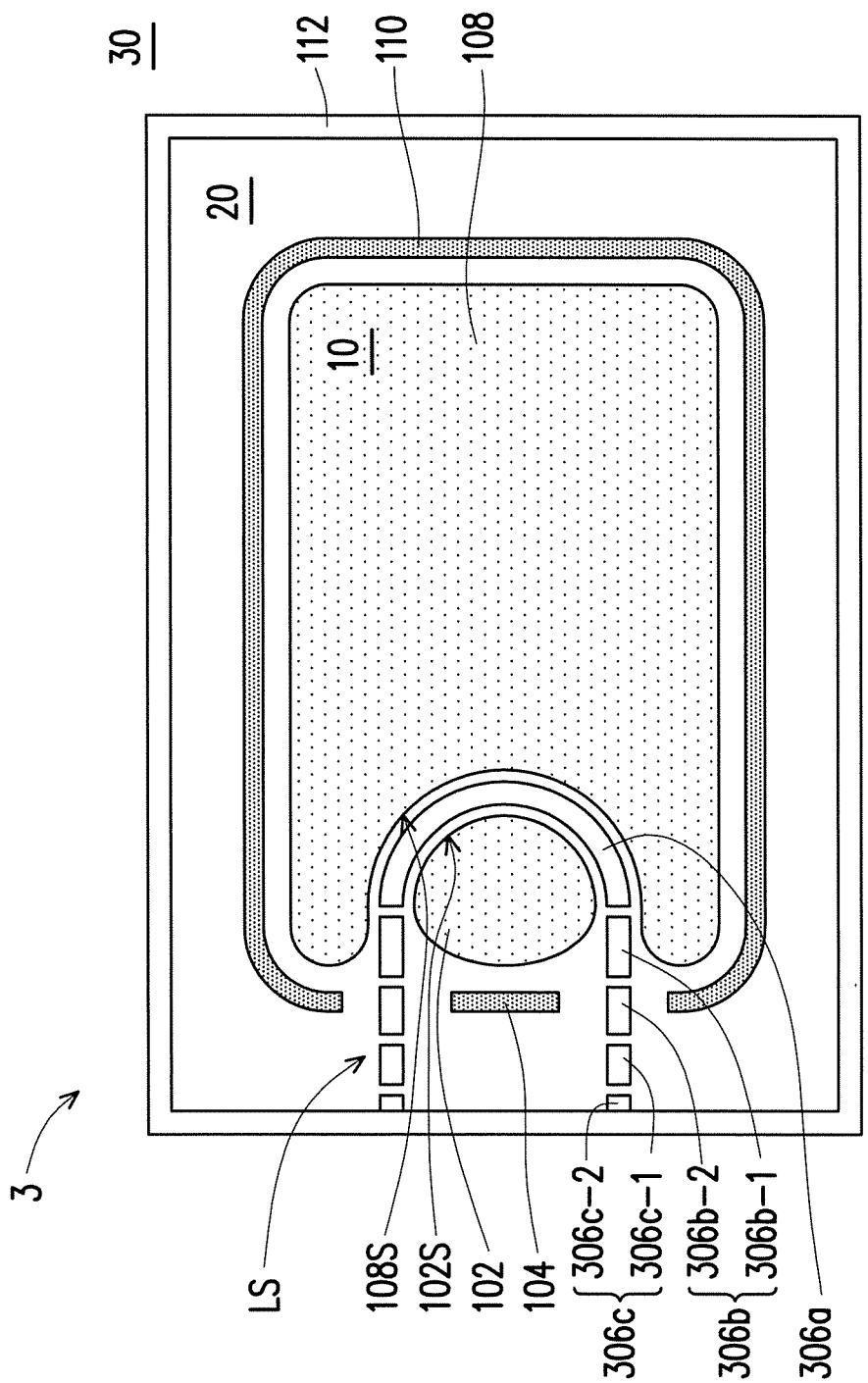

Semiconductor structures in FIG. 2 to FIG. 4 are similar to the semiconductor structure in FIG. 1 except for shapes of isolation structures. Differences between them are described below, and similarities are omitted hereinafter.

In a level shifter LS of a semiconductor structure 2 in FIG. 2, a width of an isolation structure 206 decreases in a stepwise manner in a direction away from the high-side circuit area 10 (or toward the low-side circuit area 30). Specifically, when viewed from the high-side circuit area 10 to the low-side circuit area 30, the isolation structure 206 has a step-shaped sidewall. In an embodiment, the isolation structure 206 can have, for example but not limited to, a first isolation doped region 206a, a second isolation doped region 206b, and a third isolation doped region 206c. The first isolation doped region 206a is adjacent to the high-side circuit area 10 and is completely located between the buried layer 108 and the buried island 102. In an embodiment, the first isolation doped region 206a has a substantially unchanged width. The second isolation doped region 206b is adjacent to and in contact with the first isolation doped region 206a, and a portion of the second isolation doped region 206b is located between the buried layer 108 and the buried island 102. In an embodiment, the second isolation doped region 206b has a substantially unchanged width. The width of the second isolation doped region 206b is less than the width of the first isolation doped region 206a. In addition, an outer boundary of the second isolation doped region 206b can exceed or be aligned with the outer boundary of the doped region 104. The third isolation doped region 206c is adjacent to the second isolation doped region 206b and the low-side circuit area 30. In an embodiment, the third isolation doped region 206c is in contact with the well region 112. The third isolation doped region 206c has a substantially unchanged width. The width of the third isolation doped region 206c is less than the width of the second isolation doped region 206b. Besides, as shown in FIG. 6, a doping depth of the isolation structure 206 decreases gradually in a direction away from the high-side circuit area 10.

In the level shifters of the semiconductor structures 1 and 2 in FIG. 1 and FIG. 2, the isolation structures 106 and 206 are bulk isolation doped regions. However, the invention is not limited thereto. In another embodiment, as shown in FIG. 3 and FIG. 4, the isolation structures can have a plurality of separated isolation doped regions.

In a level shifter LS of a semiconductor structure 3 in FIG. 3, a length of an isolation structure 306 decreases in a direction away from the high-side circuit area 10 (or toward the low-side circuit area 30). In an embodiment, the isolation structure 306 can have, for example but not limited to, a first isolation doped region 306a, a second isolation doped region 306b, and a third isolation doped region 306c. The first isolation doped region 306a is adjacent to the high-side circuit area 10 and is completely located between the buried layer 108 and the buried island 102. In an embodiment, the first isolation doped region 306a has a substantially unchanged width. The second isolation doped region 306b is adjacent to but not in contact with the first isolation doped region 306a, and a portion of the second isolation doped region 306b is located between the buried layer 108 and the buried island 102. In an embodiment, the second isolation doped region 306b can have doped blocks 306b-1 and 306b-2. A width of each of the doped block 306b-1 and 306b-2 is substantially identical to a width of the first isolation doped region 306a. Besides, a length of the first isolation doped region 306a is greater than a length of the doped block 306b-1, and the length of the doped block 306b-1 is greater than a length of the doped block 306b-2. In addition, an outer boundary of the doped block 306U-2 can exceed or be aligned with the outer boundary of the doped region 104. The third isolation doped region 306c is adjacent to the second isolation doped region 306b and the low-side circuit area 30. In an embodiment, the third isolation doped region 306c is in contact with the well region 112 but not in contact with the second isolation doped region 306b. In an embodiment, the third isolation doped region 306c can have doped blocks 306c-1 and 306c-2. A width of each of the doped block 306c-1 and 306c-2 is substantially identical to the width of each of the doped blocks 306b-1 and 306b-2. Besides, the length of the doped block 306b-2 is greater than a length of the doped block 306c-1, and the length of the doped block 306c-1 is greater than a length of the doped block 306c-2. Besides, as shown in FIG. 7, a doping depth of the isolation structure 306 decreases gradually in a direction away from the high-side circuit area 10.

Widths of multiple isolation doped regions of the isolation structure 306 in FIG. 3 are identical while lengths of the isolation doped regions of the same decrease in a direction away from the high-side circuit area 10 (or toward the low-side circuit area 30). However, the invention is not limited thereto. In an isolation structure 406 in FIG. 4, widths and lengths of multiple isolation doped regions decrease in a direction away from the high-side circuit area 10 (or toward the low-side circuit area 30). Specifically, an average length/width of a first isolation doped region 406a is greater than an average length/width of a second isolation doped region 406b, and the average length/width of the second isolation doped region 406b is greater than an average length/width of a third isolation doped region 406c. Besides, in the second isolation doped region 406b and the third isolation doped region 406c, a length/width of a doped block 406b-1 is greater than a length/width of a doped block 406b-2, the length/width of the doped block 406b-2 is greater than a length/width of a doped block 406c-1, and the length/width of the doped block 406c-1 is greater than a length/width of a doped block 406c-2. Besides, as shown in FIG. 7, a doping depth of the isolation structure 406 decreases gradually in a direction away from the high-side circuit area 10.

In the embodiments of FIG. 3 and FIG. 4, gaps between the doped blocks are substantially constant, but the invention is not limited thereto. In another embodiment, the gaps between the doped blocks can increase gradually in a direction away from the high-side circuit area 10 (or toward the low-side circuit area 30) upon the process requirements.

In the above embodiments, the isolation structure can be exemplified as having three separated isolation doped regions, but the invention is not limited thereto. Specifically, the isolation structure can have a plurality of separated isolation doped regions. An (i+1)-th isolation doped region is closer to the low-side circuit area 30 than an i-th isolation doped region, and i is a positive integer. In addition, a length of the (i+1)-th isolation doped region is less than a length of the i-th isolation doped region, and a depth of the of the (i+1)-th isolation doped region is less than a depth of the i-th isolation doped region.

In an embodiment, a bottom surface of at least a portion of the isolation structure 106/206/306/406 is lower than a top surface of the buried island 102. In an embodiment, a bottom surface of at least a portion of the isolation structure 106/206/306/406 is lower than a top surface of the well region 112 in the low-side circuit area 30.

In addition, the isolation structure 106/206/306/406 in FIG. 1 to FIG. 4 showing gradual dimension/doping depth changes can be defined and completed through a single photomask and a single implantation process. Therefore, high market competitiveness owing to such simple process can be easily achieved.

Besides, in addition to the change in dimension(s) of the isolation structure, the doping concentration of the isolation structure can also be changed. By such manner, the isolation regions can be fully depleted, the leakage current can be effectively suppressed, and the breakdown voltage can be increased. As shown in FIG. 5, a width of an isolation structure 506 of a level shifter LS is substantially unchanged. However, a doping concentration of the isolation structure 506 near the high-side circuit area 10 is different from a doping concentration of the isolation structure 506 near the low-side circuit area 30. In an embodiment, the doping concentration of the isolation structure 506 decreases or decreases gradually in a stepwise manner in a direction away from the high-side circuit area 10. In an embodiment, as shown in FIG. 8, a doping depth of the isolation structure 506 decreases or decreases gradually in a stepwise manner in a direction away from the high-side circuit area 10.

In an embodiment, the isolation structure 506 can have, for example but not limited to, a first isolation doped region 506a, a second isolation doped region 506b, and a third isolation doped region 506c. An average doping concentration of the first isolation doped region 506a is greater than an average doping concentration of the second isolation doped region 506b, and the average doping concentration of the second isolation doped region 506b is greater than an average doping concentration of the third isolation doped region 506c. In an embodiment, a doping concentration of the first isolation doped region 506a can fall within a range between $1 \times 10^{16}$ atoms/cm$^3$ and $1 \times 10^{18}$ atoms/cm$^3$, a doping concentration of the second isolation doped region 506b can fall within a range between $1 \times 10^{16}$ atoms/cm$^3$ and $5 \times 10^{17}$ atoms/cm$^3$, and a doping concentration of the third isolation doped region 506c can fall within a range between $5 \times 10^{15}$ atoms/cm$^3$ and $1 \times 10^{17}$ atoms/cm$^3$. In an embodiment, a bottom surface of the isolation structure 506 is lower than a top surface of the buried island 102 or the well region 112.

In summary, an isolation structure with a gradually changed dimension and/or a gradually changed doping concentration is disposed in the semiconductor device or the level shifter of the invention, such that the isolation region can be fully depleted, the accumulation of high electric field effect between the high-side circuit area and the low-side circuit area can be uniformly dispersed, the leakage current can be effectively suppressed, and the breakdown voltage can be accordingly increased.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A level shifter, located between a high-side circuit area and a low-side circuit area and comprising:
   a substrate;

a buried island, having a first conductivity type and buried in the substrate; and an isolation structure, having a second conductivity type, located in the substrate and surrounding the buried island, wherein a dimension of the isolation structure near the high-side circuit area is different from a dimension of the isolation structure near the low-side circuit area, wherein a width of the isolation structure decreases gradually or decreases in a stepwise manner in a direction away from the high-side circuit area, and wherein a doping depth of the isolation structure decreases gradually in a direction away from the high-side circuit area.

2. The level shifter as claimed in claim 1, wherein the dimension comprises a length, a width or both.

3. The level shifter as claimed in claim 1, wherein the isolation structure is a bulk isolation doped region.

4. The level shifter as claimed in claim 1, wherein the isolation structure has a plurality of separated isolation doped regions, an (i+1)-th isolation doped region is closer to the low-side circuit area than an i-th isolation doped region, and i is a positive integer.

5. The level shifter as claimed in claim 4, wherein a length of the (i+1)-th isolation doped region is less than a length of the i-th isolation doped region.

6. The level shifter as claimed in claim 5, wherein a depth of the (i+1)-th isolation doped region is less than a depth of the i-th isolation doped region.

7. The level shifter as claimed in claim 1, further comprising a doped region of the first conductivity type, the doped region being located in the substrate between the buried island and the low-side circuit area and surrounded by the isolation structure.

8. The level shifter as claimed in claim 7, wherein the doped region is a drain of the level shifter.

9. A semiconductor device, comprising:
a substrate, having a high-side circuit area, a terminal area, and a low-side circuit area, wherein the low-side circuit area surrounds the high-side circuit area and the terminal area is located between the high-side circuit area and the low-side circuit area;
a high-side circuit, located in the high-side circuit area and comprising a buried layer, the buried layer having a first conductivity type and buried in the substrate; and
a level shifter, located in the terminal area and comprising:
   a buried island, having the first conductivity type and buried in the substrate; and
   an isolation structure, having a second conductivity type, located in the substrate and surrounding the buried island, wherein a dimension of the isolation structure near the high-side circuit area is different from a dimension of the isolation structure near the low-side circuit area, wherein a concave surface of the buried layer corresponds to a convex surface of the buried island, and the isolation structure is located between the buried layer and the buried island, wherein a width of the isolation structure decreases gradually or decreases in a stepwise manner in a direction away from the high-side circuit area, and wherein a doping depth of the isolation structure decreases gradually in a direction away from the high-side circuit area.

10. The semiconductor device as claimed in claim 9, wherein the high-side circuit area is a high-side bridge circuit area, and the low-side circuit area is a low-side bridge circuit area.

11. The semiconductor device as claimed in claim 9, wherein the level shifter further comprises a doped region of the first conductivity type, and the doped region is located in the substrate between the buried island and the low-side circuit area and surrounded by the isolation structure.

12. The semiconductor device as claimed in claim 9, wherein the isolation structure comprises:
   a first isolation doped region, adjacent to the high-side circuit area and completely located between the buried layer and the buried island;
   a second isolation doped region, adjacent to the first isolation doped region and partially located between the buried layer and the buried island; and
   a third isolation doped region, adjacent to the second isolation doped region and the low-side circuit area.

13. The semiconductor device as claimed in claim 12, wherein the first isolation doped region is in contact with the second isolation doped region, and the second isolation doped region is in contact with the third isolation doped region.

14. The semiconductor device as claimed in claim 12, wherein the first isolation doped region, the second isolation doped region, and the third isolation doped region are separated from one another.

15. A level shifter, located between a high-side circuit area and a low-side circuit area and comprising:
   a substrate;
   a buried island, having a first conductivity type and located in the substrate; and
   an isolation structure, having a second conductivity type, located in the substrate and surrounding the buried island, wherein a width of the isolation structure is substantially unchanged, but a doping concentration of the isolation structure near the high-side circuit area is different from a doping concentration of the isolation structure near the low-side circuit area, and a doping depth of the isolation structure decreases gradually in a direction away from the high-side circuit area.

16. The level shifter as claimed in claim 15, wherein the doping concentration of the isolation structure decreases gradually or decreases in a stepwise manner in a direction away from the high-side circuit area.

* * * * *